(12) United States Patent
Menon et al.

(10) Patent No.: US 7,405,806 B2
(45) Date of Patent: Jul. 29, 2008

(54) IMAGING SYSTEM AND METHOD EMPLOYING BEAM FOLDING

(75) Inventors: Rajesh Menon, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 302 days.

(21) Appl. No.: 11/106,204

(22) Filed: Apr. 14, 2005

(65) Prior Publication Data

US 2006/0232755 A1    Oct. 19, 2006

(51) Int. Cl.
  *G03B 27/42* (2006.01)
  *G03B 27/54* (2006.01)
(52) U.S. Cl. .......................................... 355/53; 355/67
(58) Field of Classification Search .................. 355/53, 355/67–71; 430/5, 20, 30; 250/492.2; 359/291–292, 359/62
See application file for complete search history.

(56) References Cited

U.S. PATENT DOCUMENTS 5,900,637 A * 5/1999 Smith .................... 250/492.22
6,965,436 B2 * 11/2005 Latypov et al. ............. 356/520

* cited by examiner

*Primary Examiner*—Hung Henry Nguyen
(74) *Attorney, Agent, or Firm*—Gauthier & Connors LLP

(57) ABSTRACT

A maskless lithography system is disclosed that includes a spatial light modulator, first and second imaging areas, and first folding optics. The spatial light modulator receives illumination from an illumination source and provides a modulated illumination beam having a first cross-sectional line length in a length-wise direction and a first cross-sectional width in a width-wise direction that is substantially smaller than said first cross-sectional length. The first imaging area receives a first portion of the modulated illumination beam. The first folding optics provides a second portion of the modulated illumination beam that is adjacent the first portion of the modulated illumination beam in the length-wise direction at a second imaging area that is not adjacent the first imaging area in the length-wise direction.

18 Claims, 6 Drawing Sheets

IMAGING SYSTEM AND METHOD EMPLOYING BEAM FOLDING

This invention was made with support from the United States government under Grant No. DAAD19-01-1-0330, and the United States government has certain rights to the invention.

BACKGROUND

The present invention relates to imaging systems, and relates in particular to maskless lithography systems.

In a maskless lithography system, an array of diffractive lenses such as Fresnel zone plates may be used to form an array of tightly focused spots on a photosensitive layer that is on top of a substrate. For example, U.S. Pat. No. 5,900,637 discloses a maskless lithograph system and method that employs a multiplexed array of Fresnel zone plates. The light incident on each diffractive lens may be controlled, for example, by one pixel of a spatial light modulator. The spatial light modulator for use in such a system should provide a high refresh rate, be able to operate at short wavelengths such as under 200 nm, and be able to perform grayscaling or intensity modulation in real time.

One commercially available spatial light modulator that may satisfy the above requirements is the grating light valve (GLV) spatial light modulator made by Silicon Light Machines of Sunnyvale, Calif. The GLV consists of a linear array of pixels, and each pixel consists of six metallic ribbons that form a diffraction grating. Alternate ribbons may be moved by electrostatic actuation to provide either a reflective surface or a grating.

In a maskless lithography system employing a GLV, one pixel of a GLV 10 addresses light into one zone plate 12 of a zone-plate-array 14 as shown in FIG. 1. The zone plate 12 then focuses the light onto a writing surface 16 of a substrate 18 that is supported by a stage 20. When actuated, light from the +1 order of the pixel on the GLV 10 is directed toward the zone-pate 12. When the pixel is not actuated, light from the GLV 10 is directed into the 0 order (as shown at 24 for the surrounding pixels on the GLV 10). Real-time grayscaling may be achieved by varying the depth to which the ribbons of the GLV 10 are pulled.

Since the GLV is a linear device, at any instant of exposure the focused spots lie on a line having a length L on the writing surface 16 of the substrate 18. Although the lens array 14 and writing surface 16 are shown as including five lens and five associated pixels only for diagrammatic purposes, the line may have a length of for example, 1088 pixels in certain applications. In semiconductor lithography for example, a writing line may be sequentially imaged over the two-dimensional writing surface in, for example, a serpentine fashion. The substrate in such a semiconductor lithography system may include a silicon wafer and the focal distances may be on the order of nanometers. It may be difficult however, in certain semiconductor lithography systems to provide a line area on a wafer that is flat to within the depth-of-focus distance of the lens array. In such cases, it may be necessary to reduce the length of the line, which increases the time required to image the writing surface 16. Further, certain spatial light modulators are capable of modulating far more pixels than may be imaged onto the writing surface as a line.

There is a need therefore, for an imaging system that more efficiently and economically provides maskless lithography using a spatial light valve that provides a line of modulated illumination.

SUMMARY OF THE INVENTION

The invention provides a maskless lithography system that includes a spatial light modulator, first and second imaging areas, and first folding optics. The spatial light modulator receives illumination from an illumination source and provides a modulated illumination beam having a first cross-sectional line length in a length-wise direction and a first cross-sectional width in a width-wise direction that is substantially smaller than said first cross-sectional length. The first imaging area receives a first portion of the modulated illumination beam. The first folding optics provides a second portion of the modulated illumination beam that is adjacent the first portion of the modulated illumination beam in the length-wise direction at a second imaging area that is not adjacent the first imaging area in the length-wise direction.

BRIEF DESCRIPTION OF THE DRAWINGS

The following description may be further understood with reference to the accompanying drawings in which.

The drawings are shown for illustrative purposes only and are not necessarily to scale.

DETAILED DESCRIPTION OF THE ILLUSTRATED EMBODIMENTS

The invention provides an optical beam-folding technique that may be used to precisely fold the light output from a one-dimensional spatial-light modulator (such as a GLV) into a quasi-two-dimensional form in accordance with an embodiment. This is important for certain applications such as maskless lithography, where the light from each pixel of a spatial-light modulator addresses the light incident on a diffractive-lens array such as in zone-plate-array lithography as disclosed, for example in U.S. Pat. No. 5,900,637, the disclosure of which is hereby incorporated by reference.

Figure 1:
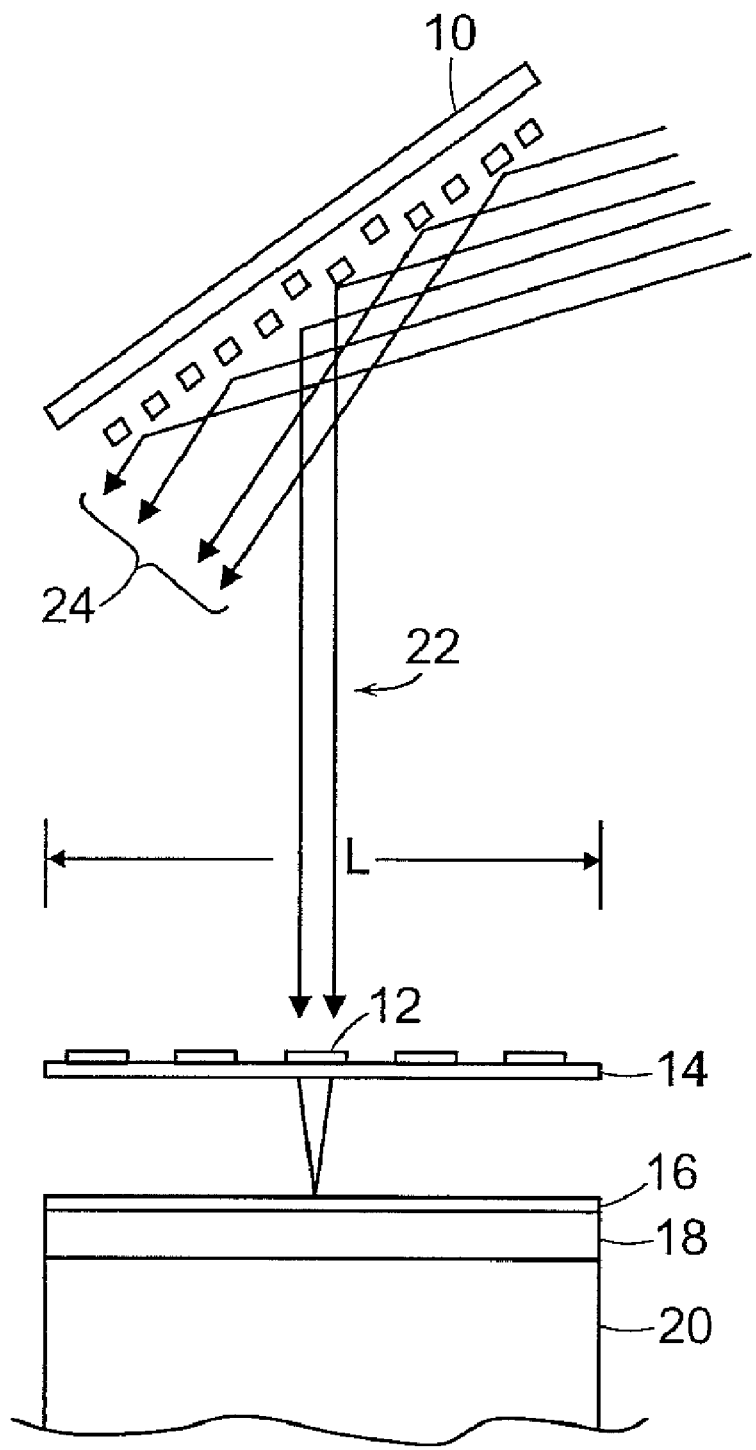
FIG. 1 shows an illustrative diagrammatic view of a maskless lithography system in accordance with the prior art.
Figure 2:
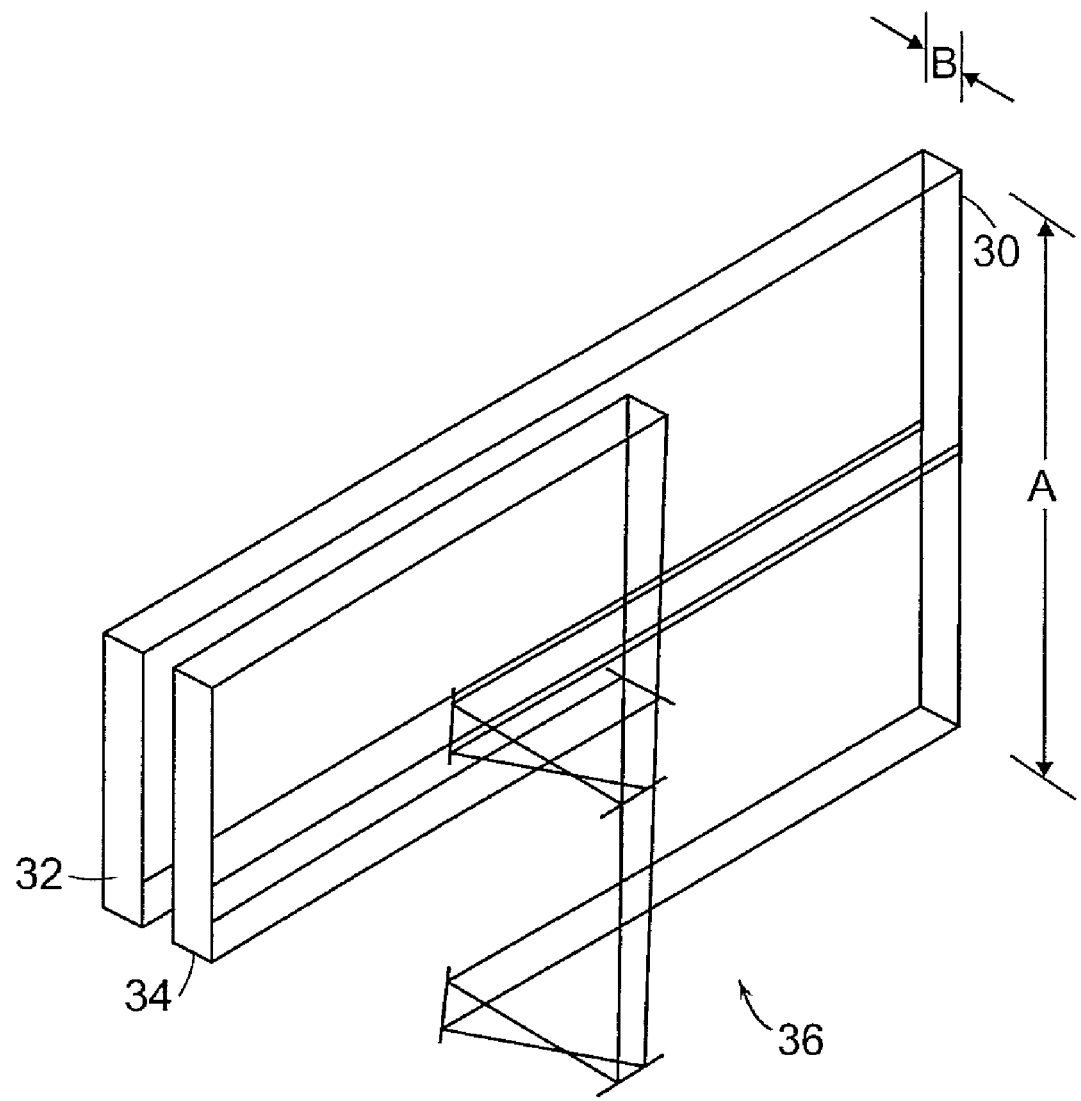
FIG. 2 shows an illustrative diagrammatic view of imaging optics for a maskless lithography system in accordance with an embodiment of the invention.

As shown in FIG. 2, a combination of prisms or mirrors may be used to fold a portion of a modulated beam optically in accordance with an embodiment of the invention. In particular, such a system may include a spatial light modulator 30 that provides a modulated illumination field having a length A and a width B, as well as two linear zone-plate-arrays 32 and 34. A first portion of the modulated illumination field from the modulator 30 is imaged directly toward the first zone-plate-array 32, while a second portion of the modulated illumination field from the modulator 30 is imaged toward the second zone-plate-array 34 using folding optics 36. The folding optics 36 may include a combination of mirrors, prisms and/or lenses that uniformly re-direct the second portion of the modulated illumination field toward the second zone-plate-array 34. The resulting two modulated illumination fields are therefore directed toward zone-plate-arrays 32 and 34 that are adjacent in a width-wise direction rather than in a length-wise direction as would be the case if the folding optics were not present. The folding optics may include discrete mirrors or prisms for redirecting illumination associate with each respective pixel, or may include an arrangement of elongated mirrors, prisms and/or lenses for manipulating each of the pixels together as an elongated beam. A system such as this may provide very high precision resulting in very accurate imaging. The modulated illumination field may employ modulation of a first-order reflection off of the modulator 30. Alternatively, this technique may be used to fold the zero-order beam for zero-order imaging using zero order reflection instead of using first order reflection for first order imaging.

The source may be a laser light source or a bright lamp with small bandwidth. In case of the array, each element in the array may be a laser diode, VCSEL or LED. The modulator or multiplexer may be any one-dimensional spatial light modulator, such as for example the silicon light machines, GLV. The array of diffractive-focusing elements may take the form of amplitude or phase zone plates (which form focused spots on the sample), spiral phase zone plate (which produce doughnut-shaped spots on the sample), or bessel zone plate (which produce focused spots with large depth-of-focus). These elements may be microfabricated using planar processes.

Figure 3:
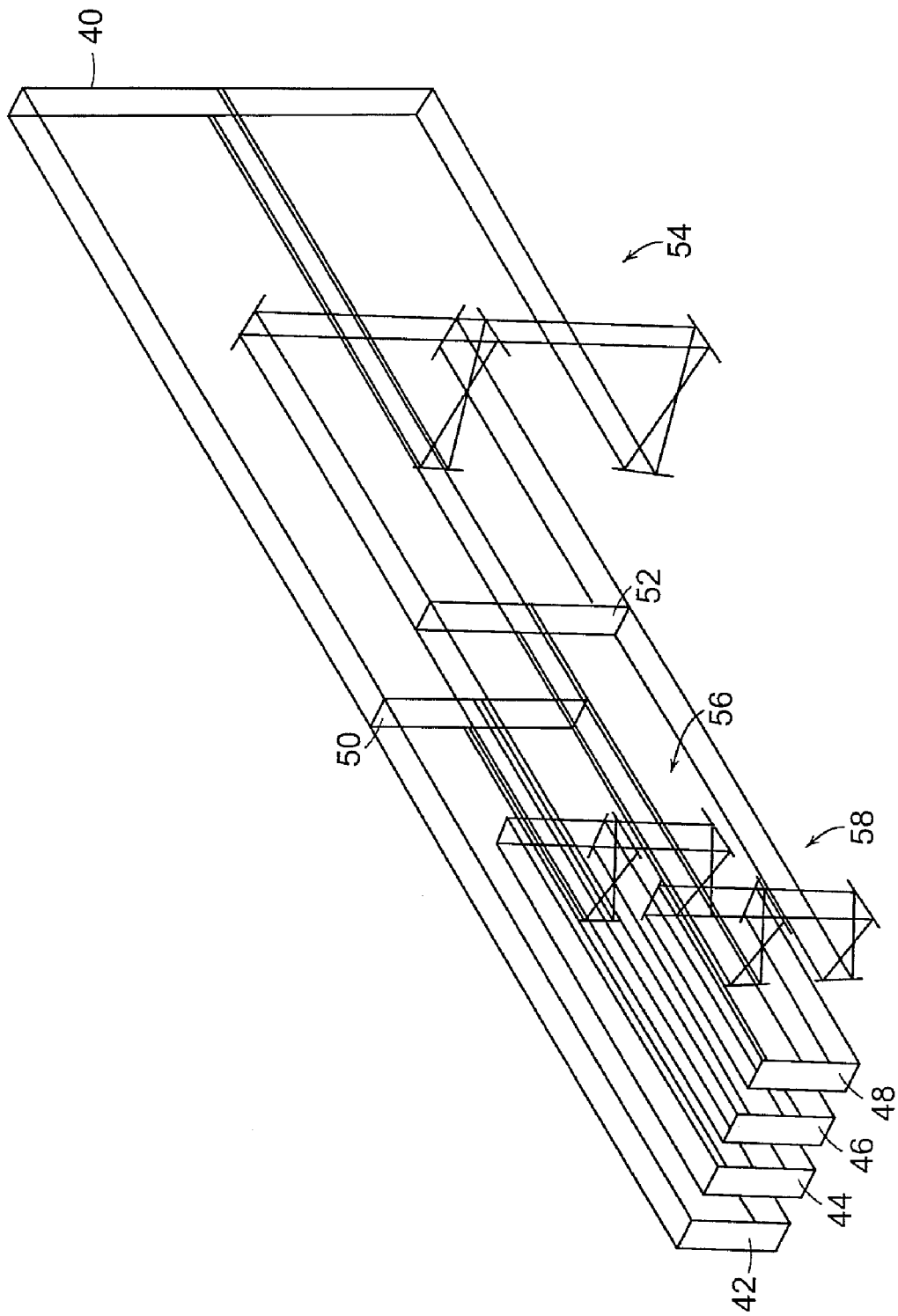
FIG. 3 shows an illustrative diagrammatic view of imaging optics for a maskless lithography system in accordance with another embodiment of the invention.

In further embodiments, the first order (signal) beam reflected off one GLV device may be folded to address four linear zone-plate-arrays. As shown in FIG. 3, such a system may involve two stages of beam folding using the folding discussed above in connection with FIG. 2. In particular, the system may include a spatial light modulator 40 and four zone-plate-arrays 42, 44, 46 and 48. A first portion of a modulated illumination field from the modulator 40 is imaged toward a first imaging plane 50, while a second portion of the modulated illumination field from the modulator 40 is imaged toward a second imaging plane 52 using folding optics 54. A first portion of the illumination from the first imaging plane 50 is imaged toward the first zone-plate-array 42, while a second portion of the illumination from the first imaging plane 50 is imaged toward a second zone-plate-array 44 using folding optics 56. Similarly, a first portion of the illumination from the second imaging plane 52 is imaged toward the third zone-plate-array 46, while a second portion of the illumination from the second imaging plane 52 is imaged toward a fourth zone-plate-array 48 using folding optics 58. If the modulator 40 is a GLV having 1088 pixels, each zone-plate-array may contains 237 zone plates, providing that some GLV pixels may be sacrificed in the folding process.

Figure 4:
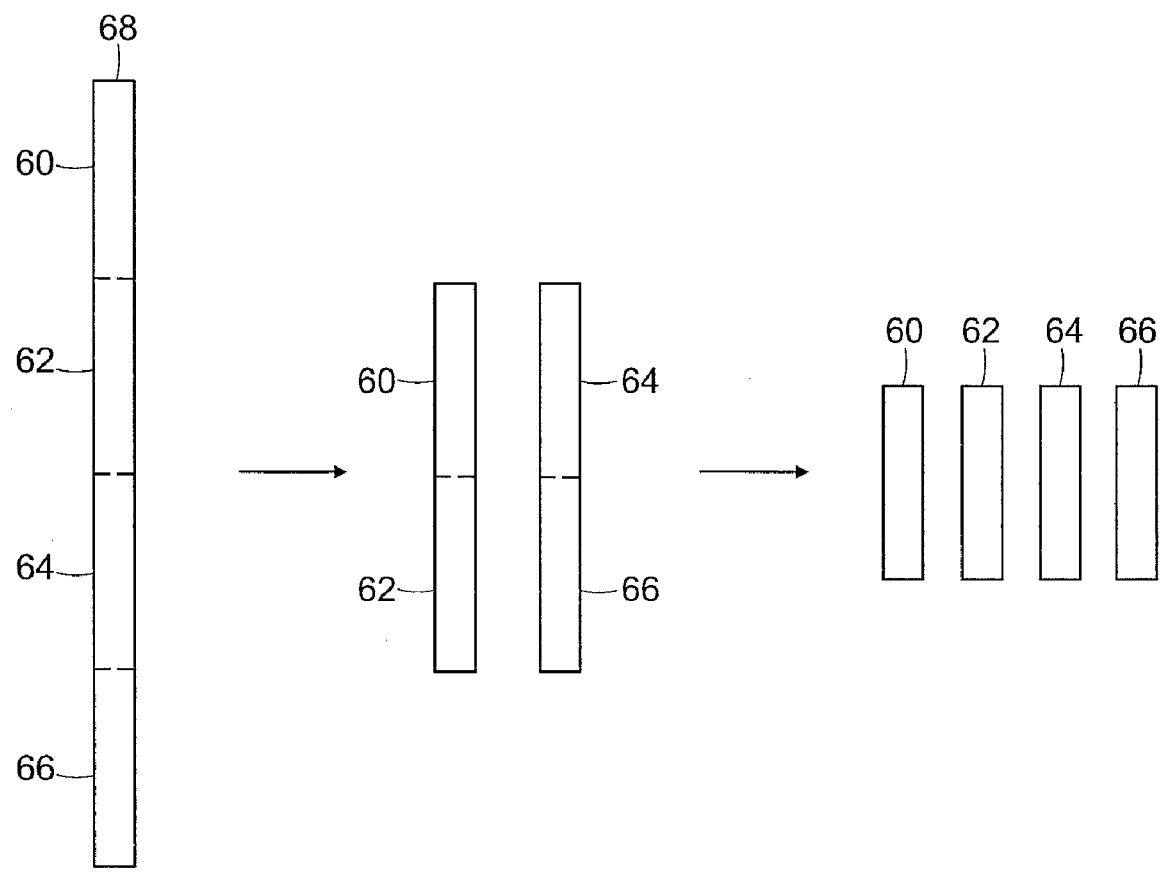
FIG. 4 shows an illustrative schematic functional view of a system in accordance with a further embodiment of the invention.

As diagrammatically shown in FIG. 4, in certain embodiments, the folding may be achieved such that the four resulting zone-plate-arrays are positioned along a center line from the modulator, and the illumination from each portion 60, 62, 64 and 66 of the modulator 68 may be directed toward adjacent regions on the writing surface that are no longer adjacent one another in a length-wise direction as they were at the modulator 68.

Figure 5:
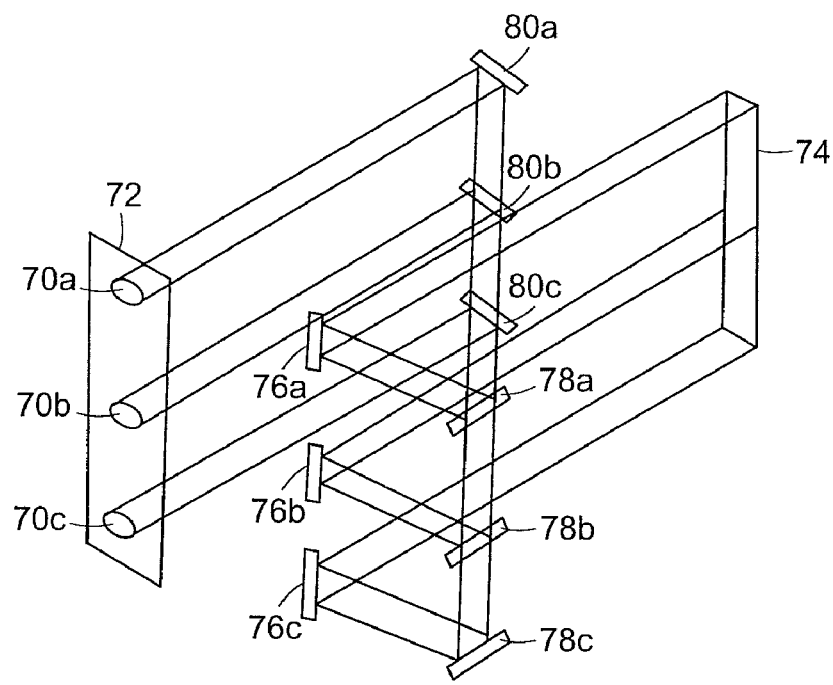
FIGS. 5-8 show illustrative diagrammatic views of imaging optics for use in a variety of further embodiments of the invention.

The folding optics may include a variety of arrangements of optical elements. For example, the folding optics may employ separate mirrors and lenses for directing the modulated illumination for each pixel. FIG. 5 shows folding optics that provide imaging for three pixels (for illustrative purposes) at zone-plates 70a, 70b and 70c in a zone-plate-array 72. Modulated illumination from the modulator 74 is directed toward the zone-plates 70a, 70b and 70c via individual reflector elements 76a, 76b and 76c, reflector elements 78a, 78b and 78c, and reflector elements 80a, 80b and 80c respectively as shown in FIG. 5. Each of the reflector elements may be a micro-mirror that re-directs illumination for a pixel along a folding path toward the zone-plates 70a, 70b and 70c.

Figure 6:
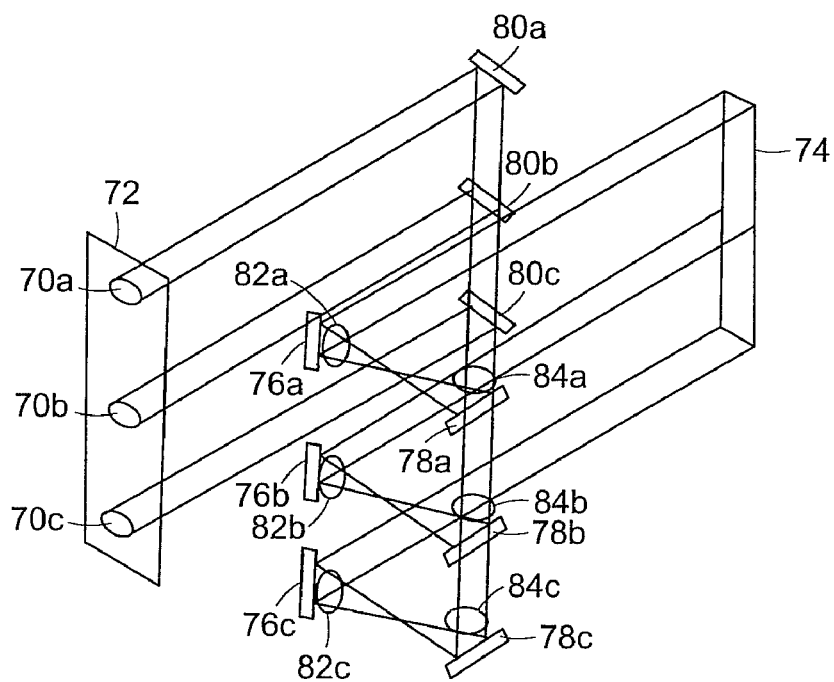

In the system of FIG. 5, the modulated illumination for each zone-plate is reversed in that the left side of the illumination for zone-plate 70a will appear at the right side of zone-plate 70a, and the right side of the illumination for zone-plate 70a will appear at the left side of zone-plate 70a. In many applications, this may be of no consequence. If, however, it is desired to maintain the orientation of the modulated illumination at the zone-plate-array, then focusing lenses 82a, 82b and 82c as well as collimating lenses 84a, 84b and 84c may additionally be used to maintain the orientation of the modulated illumination at the zone-plate-array as shown in FIG. 6.

Figure 7:
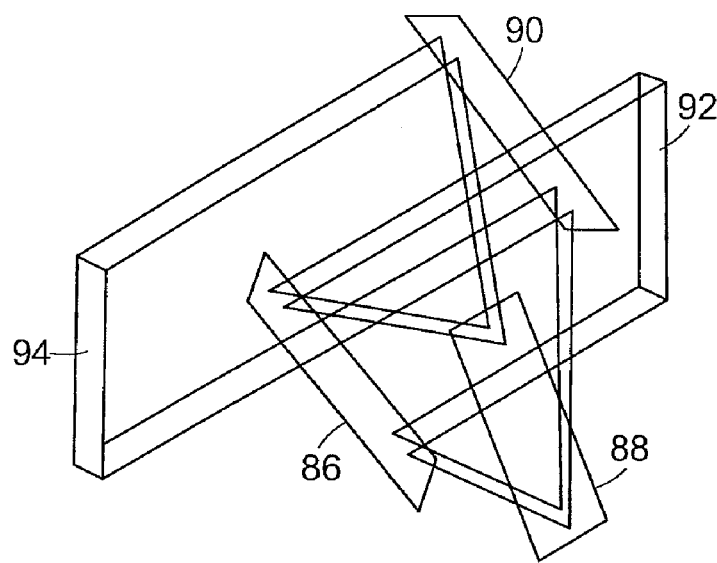
Figure 8:
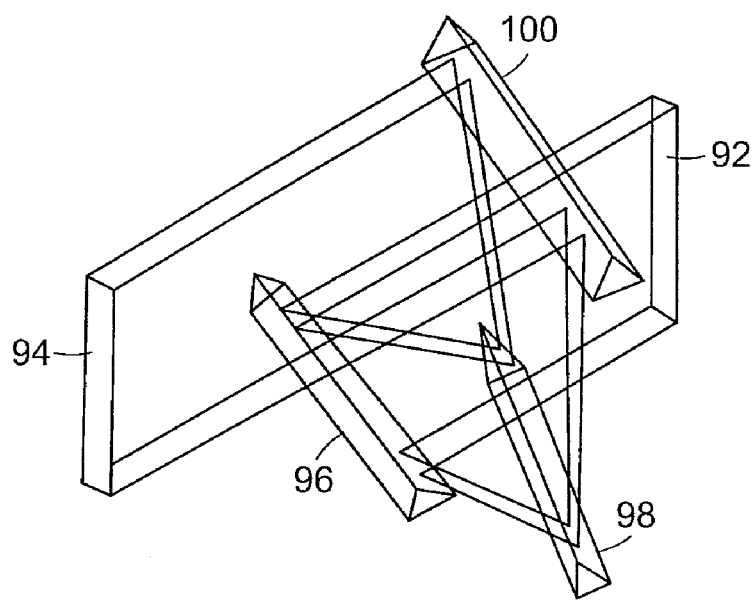

In further embodiments, the folding optics may employ unitary elongated mirrors 86, 88 and 90 for directing a substantial portion of the modulated illumination field from the modulator 92 toward the zone-plate-array 94 using unitary mirrors instead of individual mirrors for each pixel as shown in FIG. 7. In further embodiments, a plurality of unitary prisms 96, 98 and 100 may be used to direct the modulated illumination from the modulator 92 toward the zone-plate-array 94 as shown in FIG. 8.

Those skilled in the art will appreciate that numerous modifications and variations may be made to the above disclosed embodiments without departing from the spirit and scope of the invention.

What is claimed is:

1. A maskless lithography system comprising a spatial light modulator that receives illumination from an illumination source and provides a modulated illumination beam having a first cross-sectional line length in a length-wise direction and a first cross-sectional width in a width-wise direction that is substantially smaller than said first cross-sectional length, a first imaging area for receiving a first portion of said modulated illumination beam, and first folding optics for directing a second portion of said modulated illumination beam that is adjacent said first portion of said modulated illumination beam in the length-wise direction at the spatial light modulator toward a second imaging area that is not adjacent said first imaging area in the length-wise direction.

2. The maskless lithography system as claimed in claim 1, wherein said first and second imaging areas are adjacent one another in the width-wise direction and said first portion of said modulated illumination does not pass through said folding optics.

3. The maskless lithography system as claimed in claim 1, wherein said first folding optics includes at least one mirror for directing illumination for a pixel toward the second imaging area.

4. The maskless lithography system as claimed in claim 1, wherein said first folding optics includes at least one prism for directing illumination for a pixel toward the second imaging area.

5. The maskless lithography system as claimed in claim 1, wherein said first folding optics includes at least three mirrors, each of which has a length that is at least as long as the second portion of said modulated illumination field.

6. The maskless lithography system as claimed in claim 1, wherein said first folding optics includes at least three prisms, each of which has a length that is at least as long as the second portion of said modulated illumination field.

7. The maskless lithography system as claimed in claim 1, wherein said system further includes an array of Fresnel zone plates.

8. The maskless lithography system as claimed in claim 1, where in said first portion of said modulated illumination beam has a second cross-sectional line length in a length-wise direction that is about one half of said first cross-sectional line length in the length-wise direction.

9. The maskless lithography system as claimed in claim 1, wherein said system further includes second folding optics for providing a third portion of said modulated illumination beam at a third imaging area that is not adjacent said first imaging area in the length-wise direction and is not adjacent said second imaging area in the length-wise direction.

10. A maskless lithography system comprising a spatial light modulator that receives illumination from an illumination source and provides a modulated illumination beam having a first cross-sectional line length in a length-wise direction and a first cross-sectional width in a width-wise direction that is substantially smaller than said first cross-sectional length, a first imaging area for receiving a first portion of said modulated illumination beam, and first folding optics for directing a second portion of said modulated illumination beam that is adjacent said first portion of said modulated illumination beam in the length-wise direction at the spatial light modulator toward a second imaging area that is adjacent said first imaging area in the width-wise direction.

11. The maskless lithography system as claimed in claim 10, wherein said first folding optics includes at least one mirror for directing illumination for a pixel toward the second imaging area.

12. The maskless lithography system as claimed in claim 10, wherein said first folding optics includes at least one prism for directing illumination for a pixel toward the second imaging area.

13. The maskless lithography system as claimed in claim 10, wherein said first folding optics includes at least three mirrors, each of which has a length that is at least as long as the second portion of said modulated illumination field.

14. The maskless lithography system as claimed in claim 10, wherein said first folding optics includes at least three prisms, each of which has a length that is at least as long as the second portion of said modulated illumination field.

15. The maskless lithography system as claimed in claim 10, wherein said system further includes an array of Fresnel zone plates.

16. The maskless lithography system as claimed in claim 10, where in said first portion of said modulated illumination beam has a second cross-sectional line length in a length-wise direction that is about one half of said first cross-sectional line length in the length-wise direction.

17. The maskless lithography system as claimed in claim 10, wherein said system further includes second folding optics for providing a third portion of said modulated illumination beam at a third imaging area that is not adjacent said first imaging area in the length-wise direction and is not adjacent said second imaging area in the length-wise direction.

18. The maskless lithography system as claimed in claim 10, where in said first portion of said modulated illumination beam has a second cross-sectional line length in a length-wise direction that is about one half of said first cross-sectional line length in the length-wise direction.

* * * * *